US010060797B2

(12) United States Patent
Pocas et al.

(10) Patent No.: US 10,060,797 B2
(45) Date of Patent: Aug. 28, 2018

(54) DEVICE FOR DETECTING ELECTROMAGNETIC RADIATION COMPRISING A RAISED ELECTRICAL CONNECTION PAD

(71) Applicants: Commissariat a l'energie atomique et aux energies alternatives, Paris (FR); ULIS, Veurey-Voroize (FR)

(72) Inventors: Stephane Pocas, Grenoble (FR); Agnes Arnaud, Saint Jean le Vieux (FR); Sebastien Cortial, Sassenage (FR); Jean-Jacques Yon, Sassenage (FR)

(73) Assignees: Commissariat A L'Energie Atomique et aux Energies Alternatives, Paris (FR); ULIS, Veurey-Voroize (FR)

(*) Notice: Subject to any disclaimer, the term of this patent is extended or adjusted under 35 U.S.C. 154(b) by 6 days.

(21) Appl. No.: 15/441,719

(22) Filed: Feb. 24, 2017

(65) Prior Publication Data

US 2017/0241840 A1    Aug. 24, 2017

(30) Foreign Application Priority Data

Feb. 24, 2016 (FR) .................................... 16 51511

(51) Int. Cl.
*G01J 5/20* (2006.01)
*G01J 5/02* (2006.01)
*G01J 5/22* (2006.01)
*H01L 27/146* (2006.01)
*H01L 31/18* (2006.01)

(52) U.S. Cl.
CPC ............... *G01J 5/024* (2013.01); *G01J 5/023* (2013.01); *G01J 5/20* (2013.01); *G01J 5/22* (2013.01); *H01L 27/14636* (2013.01); *H01L 27/14669* (2013.01); *H01L 27/14687* (2013.01); *H01L 31/18* (2013.01)

(58) Field of Classification Search
CPC .... G01J 5/024; G01J 5/22; G01J 5/023; G01J 5/20; H01L 27/146
USPC ........................................................ 250/338.4
See application file for complete search history.

(56) References Cited

U.S. PATENT DOCUMENTS 6,465,784 B1   10/2002 Kimata
2014/0319350 A1*  10/2014 Yon ........................... G01J 5/20
                                                                    250/338.4

FOREIGN PATENT DOCUMENTS

EP    1 041 371 A1   10/2000
EP    2 743 659 A1    6/2014

OTHER PUBLICATIONS

French Preliminary Search Report dated Jan. 17, 2017 in French Application 16 51511 filed on Feb. 24, 2016 (with English Translation of Categories of Cited Documents).

* cited by examiner

*Primary Examiner* — David Porta
*Assistant Examiner* — Meenakshi Sahu
(74) *Attorney, Agent, or Firm* — Oblon, McClelland, Maier & Neustadt, L.L.P

(57) ABSTRACT

A device for detecting electromagnetic radiation, including a readout circuit, which is located in a substrate, and an electrical connection pad, which is placed on the substrate, including a metal section that is raised above the substrate and electrically connected to the readout circuit. The detection device furthermore includes a protection wall that extends under the raised metal section so as to define therewith at least one portion of a cavity, and what is called a reinforcing layer section that is located in the cavity and on which the raised metal section rests.

18 Claims, 5 Drawing Sheets

DEVICE FOR DETECTING ELECTROMAGNETIC RADIATION COMPRISING A RAISED ELECTRICAL CONNECTION PAD

TECHNICAL FIELD

The field of the invention is that of devices for detecting electromagnetic radiation, in particular infrared or terahertz radiation, including at least one electrical connection pad that is raised above a substrate containing a readout circuit. The invention is in particular applicable to the field of infrared thermography and imaging.

PRIOR ART

A device for detecting electromagnetic radiation, for example infrared or terahertz radiation, conventionally comprises a matrix array of what are called elementary thermal detectors, each detector including a section able to absorb the electromagnetic radiation to be detected.

With the aim of ensuring the thermally insulation of the detectors, the sections conventionally take the form of membranes that are suspended above the substrate by anchoring pillars and that are thermally insulated from the substrate by thermally insulating arms. These anchoring pillars and insulating arms also have an electrical function as they are used to electrically connect the suspended membranes to a readout circuit that is generally placed in the substrate.

The readout circuit conventionally takes the form of a CMOS circuit. It allows a control signal to be applied to the thermal detectors and detection signals generated by the thermal detectors, in response to the absorption of the electromagnetic radiation to be detected, to be read. The readout circuit includes various electrical interconnection levels formed from metal lines that are electrically insulated from one another by what are called inter-metal dielectric layers. An electrical connection pad of the readout circuit is placed on the substrate so that it is possible to make contact therewith from the exterior of the detection device.

FIG. 1 illustrates an exemplary device 1 for detecting infrared radiation, such as described in document EP2743659, the electrical connection pad 30 of which includes a raised metal section 31 facing the substrate 2.

The detection device 1 includes a plurality of thermal detectors 20 each absorbing membrane 21 of which is suspended above the substrate 2 at a nonzero distance H. Each absorbing membrane 21 is electrically connected to a section 11a of metal line of the readout circuit 10, the metal line here belonging to a penultimate electrical interconnection level of a CMOS circuit.

The detection device 1 also includes a pad 30 for electrical connection of the readout circuit 10, which includes a metal section 31 that is raised above the substrate 2 and that is electrically connected to a second section 11b of the metal line here belonging to the same electrical interconnection level. The metal section 31 is here raised to the same distance H with respect to the substrate 2 as the absorbing membrane 21, and is connected to the readout circuit 10 by way of electrically conductive vias 32.

A sacrificial layer is used during the production of the absorbing membrane 21 and the raised metal section 31, and is then etched so as to suspend the absorbing membrane 21. An unetched section of the sacrificial layer may be present level with the electrical connection pad 31, i.e. between the raised metal section 31 and the substrate 2.

SUMMARY OF THE INVENTION

The objective of the invention is to provide a device for detecting electromagnetic radiation including an electrical connection pad comprising a raised metal section having an improved mechanical strength. To this end, the subject of the invention is a device for detecting electromagnetic radiation, including:
 a readout circuit that is located in a substrate;
 an electrical connection pad, which is placed on the substrate, including a metal section that is raised above the substrate and electrically connected to the readout circuit.
According to the invention, the device comprises:
 a protection wall extending under the raised metal section, so as to define therewith at least one portion of a cavity;
 a reinforcing layer section located in the cavity, on which the raised metal section rests.

The protection wall has a longitudinal dimension, or length, and a thickness according to a plane parallel to the substrate, the longitudinal dimension being larger than the thickness and preferably at least ten times larger.

Moreover, the reinforcing section is made from a mineral material and preferably from a material based on silicon oxide.

The following are certain preferred but nonlimiting aspects of this detection device.

The protection wall may include a plurality of rectilinear segments, each segment having a longitudinal dimension and a thickness according to a plane parallel to the substrate, the longitudinal dimension being larger than the thickness and preferably at least ten times larger. By rectilinear segments, what is meant is a segment that extends longitudinally, in a plane parallel to the substrate, rectilinearly.

The reinforcing section may have a surface extent that is larger than or equal to 25%, preferably 50% and more preferably 75% of that of what is called a lower surface, which is oriented toward the substrate, of the raised metal section.

The protection wall may extend continuously so as to define a closed cavity.

The protection wall may extend continuously so as to define a cavity that is open locally.

The detection device may include at least one thermal detector that is placed on the substrate and electrically connected to the electrical connection pad by the readout circuit, and including a membrane that is suitable for absorbing the electromagnetic radiation to be detected and that is suspended above the substrate at a distance from the latter substantially equal to that separating the raised metal section from the substrate.

The protection wall may be made from an electrically conductive material, said wall electrically connecting the electrical connection pad to the readout circuit.

The protection wall may encircle at least one electrically conductive via electrically connecting the raised metal section to a subjacent section of a metal line of the readout circuit.

The raised metal section may have a lower surface, which is oriented toward the substrate, a dimension of which parallel to the substrate is larger than or equal to 2 times, preferably 10 times, and preferably 25 times, the distance separating said raised metal section from the substrate along an axis that is substantially orthogonal to the substrate.

The electrical connection pad may include substantially no reinforcing section outside of said cavity.

The invention also relates to a process for producing the detection device according to any one of the preceding features, comprising:

depositing a sacrificial layer on an etch-stop layer covering the substrate containing the readout circuit;

forming a protection wall through the sacrificial layer, so as to subsequently define at least one portion of a cavity;

forming a raised metal section on the sacrificial layer, so that it rests on the protection wall and participates in the definition of said cavity;

etching at least partially the sacrificial layer, a section of the sacrificial layer, called the reinforcing section, which is located in said cavity, being unetched following this etching step.

The sacrificial layer may be made of a mineral material and preferably of a material based on silicon oxide, and the etching step may be carried out by chemical attack in an acid medium and preferably in vapour-phase hydrofluoric acid.

Concomitantly to the formation of the protection wall, anchoring pillars may be formed that are intended to mechanically support absorbing membranes of thermal detectors.

BRIEF DESCRIPTION OF THE DRAWINGS

Other aspects, aims, advantages and features of the invention will become more clearly apparent on reading the following detailed description of preferred embodiments thereof, which description is given by way of nonlimiting example and with reference to the appended drawings, in which:

FIG. 3b is a schematic top view of a variant of the electrical connection pad illustrated in FIG. 3a;

DETAILED DESCRIPTION OF PARTICULAR EMBODIMENTS

In the figures and in the rest of the description, identical or similar elements are referenced with the same references. In addition, the various elements are not shown to scale in order to make the figures clearer.

Figure 1:
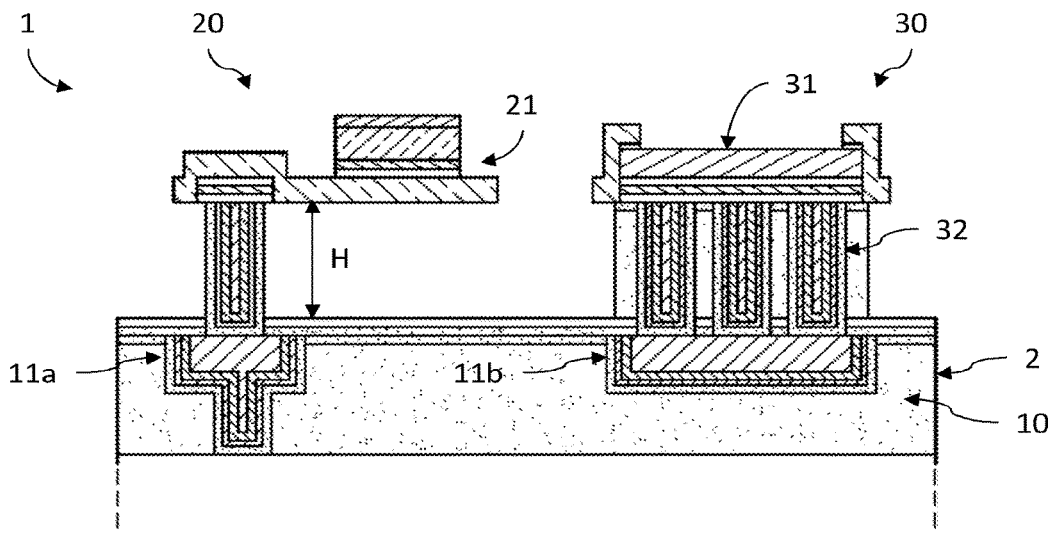
FIG. 1 is a schematic illustrating an exemplary device for detecting infrared radiation.
Figure 2:
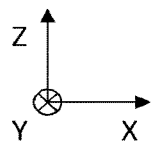
FIG. 2 is a schematic cross-sectional view of a detection device according to one embodiment.
Figure 2:
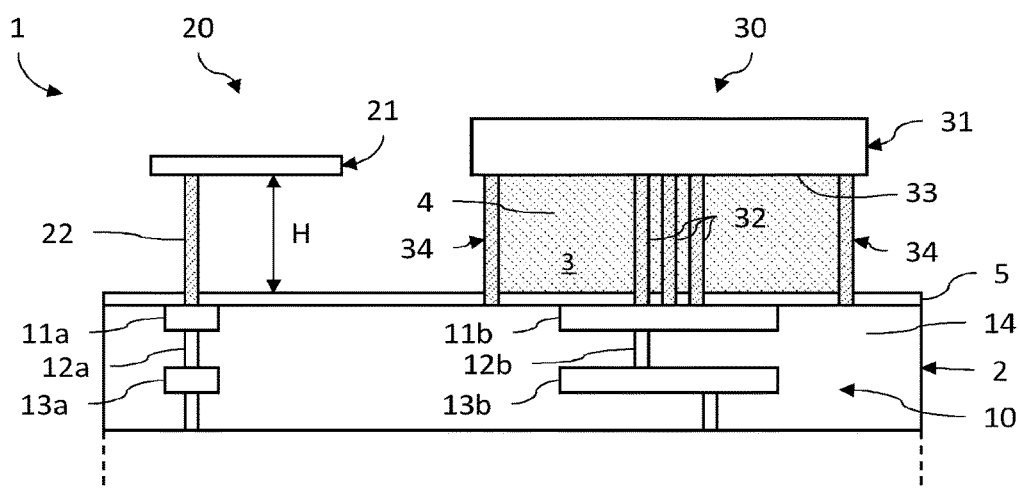

FIG. 2 is a schematic transverse cross-sectional view of a device 1 for detecting electromagnetic radiation according to a first embodiment.

Here and for the rest of the description, a three-dimensional orthonormal coordinate system (X, Y, Z) is defined in which the (X, Y)-plane is substantially parallel to the plane of a substrate of the detection device 1, the Z-axis being oriented in a direction that is substantially orthogonal to the plane of the substrate 2. Thus, the terms "vertical" and "vertically" must be understood as being relative to an orientation along the Z-axis, and the terms "lower" and "upper" must be understood as being relative to positions of increasing distance from the substrate along the Z-axis.

In this example, the device 1 for detecting electromagnetic radiation is suitable for detecting infrared or terahertz radiation. It includes a matrix array of thermal detectors 20 that are electrically connected to a readout circuit 10. FIG. 2 is a partial view of the detection device 1 and shows only a single thermal detector 20 that here is placed in the vicinity of an electrical connection pad 30.

The detection device 1 comprises a silicon-based substrate 2 comprising an electronic readout circuit 10 produced in CMOS technology allowing a control signal to be applied to the thermal detectors 10 and the detection signals to be read, said detection signals being generated in response to detection of the electromagnetic radiation of interest.

The readout circuit 10 may include a lower portion (not shown) formed from MOS electronic devices, for example transistors, diodes and capacitors, that are suitable for implementing the various electronic functions of the readout circuit. It furthermore includes a plurality of electrical interconnection levels ensuring electrical connection of the various MOS devices and thermal detectors, and the electrical linkage of at least one electrical connection pad of the readout circuit to the exterior of the detection device.

The readout circuit 10 thus includes a plurality of electrical interconnection levels that are each formed from a plurality of substantially planar metal lines that are connected to the metal lines of lower levels by electrically conductive vias, or vertical connections. The various electrical interconnection levels are separated from one another by dielectric layers that are called inter-metal dielectrics (IMDs), these layers being passed through vertically by the conductive vias. Each inter-metal dielectric layer may be made from a silicon oxide $SiO_x$ or a silicon nitride $SiN_x$, or even from a silicon-oxide-based alloy of low relative permittivity such as SiOF, SiOC, SiOCH, etc.

In this example, the readout circuit 10 includes a metal upper interconnection level formed from a first metal-line section 11a that is located facing a thermal detector 20 and intended to be electrically connected to this detector 20, and a second metal-line section 11b that is located facing an electrical connection pad 30 and intended to be electrically connected to this pad 30. The metal-line sections 11a, 11b of this metal interconnection level are electrically connected to lower-level metal-line sections 13a, 13b by conductive vias 12a, 12b. The sections 11a, 11b and the conductive vias 12a, 12b are electrically insulated from one another by an inter-metal dielectric layer 14.

The substrate 2 furthermore includes an etch-stop layer 5 that covers the surface formed by the metal-line sections 11a, 11b and by the inter-metal dielectric layer 14. This etch-stop layer 5 is in particular suitable for ensuring the protection of the substrate 2 and the readout circuit 10 from a chemical attack, for example in a hydrofluoric (HF) acid medium, used to etch some of a sacrificial layer used during the production of the detection device. This etch-stop layer 5 thus forms a chemically inert and hermetic layer that protects the subjacent metal lines and inter-metal dielectric layers from chemical attack, and it is electrically insulating in order to prevent any short-circuiting between the metal-line sections. The etch-stop layer 5 may be made from alumina $Al_2O_3$, or even from aluminum fluoride or nitride. It may have a thickness comprised between a few tens and a few hundred nanometers and for example a thickness comprised between 10 nm and 500 nm.

Here, a thermal detector 20 rests on the substrate 2, said thermal detector comprising a section 21 that is suitable for absorbing the radiation to be detected. This absorbent section 21 is thermally insulated from the substrate 2 and may be placed level with a membrane that is said to be absorbing, said membrane being suspended above the substrate 2 by supporting and thermally insulating elements such as anchoring pillars 22 that are associated with thermally insulating arms (not shown). The anchoring pillar 22 is electrically conductive and locally passes through the etch-stop layer 5 in order to make electrical contact with the section 11a of the metal line. The absorbing membrane 21 is spaced apart from the substrate 2 by a distance H that is typically comprised between 1 µm and 5 µm and for example about 2 µm when the detectors are designed to detect infrared radiation of wavelength comprised between 8 µm and 14 µm.

By way of illustration, the thermal detector 20 may be a bolometer the absorbing membrane 21 of which includes a thermistor material the electrical conductivity of which varies as a function of the temperature of the membrane. However, any other type of thermal detector may be used, for example pyroelectric detectors, ferroelectric detectors or even thermopiles.

An electrical connection pad 30 also rests on the substrate 2, said pad being intended to allow an electrical connection of the readout circuit 10 from the exterior of the detection device 1, for example by means of wire bonding or even pin probing during testing of the detection device. The electrical connection pad 30 includes a metal section 31 that is raised above the substrate 2 and electrically connected to the subjacent metal-line section 11b of the readout circuit 10.

The raised metal section 31 includes an upper face that forms a contact surface for the electrical connection, and an opposite lower face 33 that is oriented toward the substrate 2. The metal section 31 is here raised above the substrate 2 to a distance substantially equal to the distance H of the absorbing membrane 21. More precisely, the lower face of the absorbing membrane 21 and the lower face 33 of the raised metal section 31 are substantially coplanar and located at the same height H with respect to the etch-stop layer 5 of the substrate. The raised metal section 31 may be identical or similar to that described in document EP2743659. It may thus be formed from a stack of layer sections of various metal materials, for example a section of titanium nitride (TiN) covered with an aluminum section, itself optionally being covered with a TiN layer section.

In this example, the electrical connection pad 30 includes a plurality of conductive vias 32 electrically connecting the raised metal section 31 to the subjacent section 11b of the metal line of the readout circuit 10. The conductive vias 32 extend substantially vertically and make contact on the one hand with the raised metal section 31 and on the other hand with the metal-line section 11b. The conductive vias 32 may be identical or similar to those described in document EP2743659 and thus be formed from an envelope of TiN or TiW encircling the periphery of a core made of copper or tungsten. The TiN or TiW envelope may play the role of an adhesion layer and barrier layer with respect to possible diffusion of the copper. The conductive vias 32 may thus have a rod or column shape, the rod or column having in the (X, Y)-plane a substantially square cross section of area for example comprised between 0.25 µm$^2$ and 5 µm$^2$, and a height substantially equal to the distance H. Advantageously, the anchoring pillars 22 of the thermal detector are substantially identical in terms of materials and dimensions to the conductive vias 32 of the electrical connection pad 30.

The electrical connection pad 30 also includes a protection wall 34, or a plurality of concentric walls 34, that extend(s) continuously under the raised metal section 31 so as to define, with the lower face 33 thereof, a cavity 3. By define, what is meant is that the protection wall 34 sets at least some of the limits, in the (X, Y)-plane, of the cavity thus formed. The raised metal section 31 rests on the protection wall 34 and thus defines vertically, with the substrate 2, the cavity 3. The latter then has a height along the Z-axis substantially equal to the height H, and in the (X, Y)-plane a surface extent the perimeter of which is at least partially defined by the protection wall 34.

The protection wall 34 extends along the Z-axis between the substrate 2 and the raised metal section 31 and then has a height substantially equal to the distance H. It extends longitudinally over a distance that at least partially defines the border of the cavity 3 in the (X, Y)-plane. Lastly, it has a thickness, in the (X, Y)-plane, of about a few hundred nanometers to a few microns, of about 0.5 µm for example. The protection wall 34 thus differs from the anchoring pillars 22 and the conductive vias 32 in that it has a dimension, called its longitudinal dimension or length, that is larger than its thickness and, for example, 10 times, 100 times or even 2000 times larger than its thickness. It may be formed similarly to the anchoring pillars 22 and to the conductive vias 32. It may thus include a core, or heart, made of copper or tungsten intermediate between two vertical layers of TiN or TiW.

The electrical connection pad 30 also includes a layer section 4 made of a reinforcing material, said layer section being located in the cavity 3 thus defined by the protection wall 34. As will be described below, the reinforcing section 4 is advantageously obtained from a sacrificial layer used during the production of the absorbing membrane 21 and the raised metal section 31. It may thus be formed from a mineral material, i.e. from a material allowing an inter-metal dielectric layer to be formed and able to be etched for example by a chemical attack in vapour-phase hydrofluoric (HF) acid. Purely by way of illustration, this material may be a silicon oxide SiOx, or even a silicon-oxide-based alloy, optionally one of tow relative permittivity such as SiOF, SiOC, SiOCH, etc.

The reinforcing section 4 extends over the entire height of the cavity 3, and hence the raised metal section 31 at least partially rests on the reinforcing section 4. It has, in the (X, Y)-plane, a surface extent that is larger than or equal to 25% of that of the lower surface 33 of the raised metal section 31. Preferably, this surface extent of the reinforcing section 4 is larger than equal to 50%, preferably larger than or equal to 75%, or even than 80% and more of that of the lower surface 33 of the raised metal section 31. There is substantially no reinforcing section 4 located outside of the cavity 3 level with the electrical connection pad 30, and, preferably, level with the thermal detectors 20. In this example, the conductive vias 32 are located in the cavity 3 and pass through the reinforcing section 4 vertically.

Figure 3A:
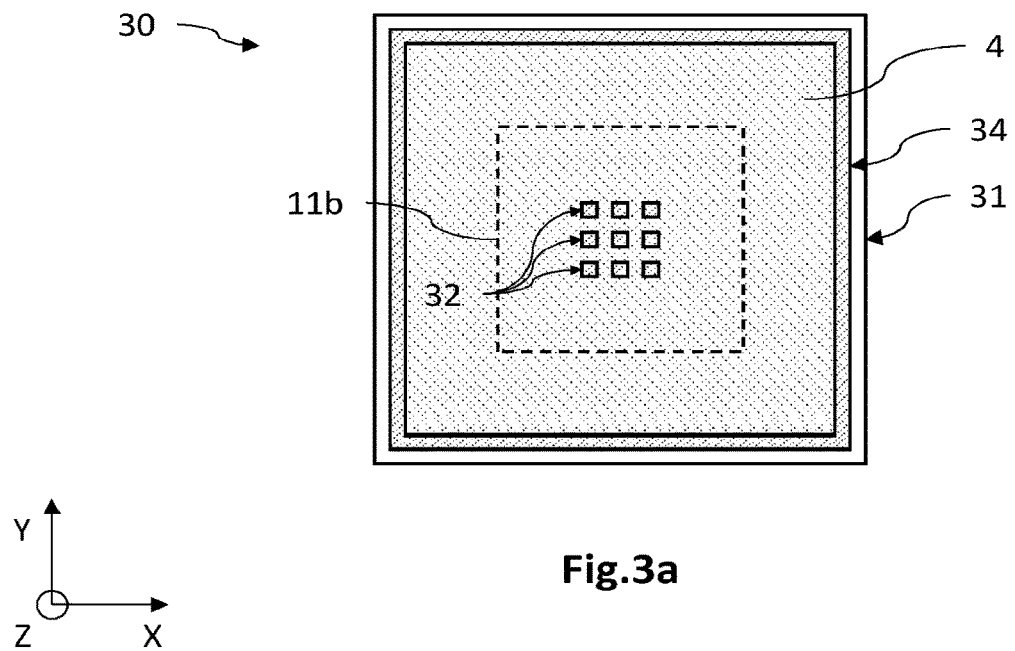
FIG. 3a is a schematic top view of the electrical connection pad of the detection device illustrated in FIG. 2.

FIG. 3a is a top view of the electrical connection pad 30 illustrated in FIG. 2. The electrical connection pad 30 here has a raised metal section 31 of substantially square cross section in the (X, Y)-plane. Other shapes are possible, for example rectangular or even polygonal, or even circular or oval. It here has dimensions in the (X, Y)-plane of about a few tens to a few hundred microns, for example 100 µm per side.

The protection wall 34 extends continuously under the raised metal section 31, here along the circumferential border of the latter, so as to define, with the substrate 2 and more precisely with the etch-stop layer 5, and with the lower face 33 of the raised metal section 31, a cavity 3 that here is closed. When the cavity 3 is said to be closed, what is meant is that the protection wall 34 forms a perimeter that is closed in the (X, Y)-plane. The closed cavity 3 is here hermetic with respect to a chemical attack in HF acid medium such as described below. In this example, the protection wall 34 here has a thickness of about 0.5 μm and a height along the Z-axis of about 2 μm and defines a cavity 3 of square area of about 90 μm per side. It may include a core made of copper or tungsten intermediate between two opposite vertical layers that are based on a titanium compound or alloy.

The closed cavity 3 is filled with a layer section 4 made of a reinforcing material that here completely fills the cavity 3. The reinforcing section 4 thus extends throughout the volume of the cavity 3, and hence the raised metal section 31 at least partially rests on the reinforcing section 4. The reinforcing section 4 is here made of a layer of a mineral material, for example a silicon oxide.

A plurality of conductive vias 32, of 0.25 μm² cross section in the (X, Y)-plane, pass through the reinforcing section 4 vertically and thus make contact with the raised metal section 31 and the subjacent section 11b of the metal line. They thus electrically connect the raised metal section 31 to the readout circuit 10.

Thus, the detection device 1 includes an electrical connection pad 30 with a raised metal section 31 the mechanical strength of which is greater because it rests on a reinforcing section 4 located in the cavity 3 defined by the protection wall 34. Specifically, it is possible, by way of the arrangement of the protection wall 34 with respect to the raised metal section 31, to control the surface extent of the reinforcing section 4 and hence to ensure it has a sufficient extent to allow the mechanical strength of the raised metal section 31 to be increased.

Specifically, the inventors have observed that when the detection device t is electrically connected by bringing an electrical element, for example a metal wire, into contact with the raised metal section 31, a mechanical stress may be applied to the electrical connection pad, in particular a shear stress in the (X, Y)-plane, this stress possibly causing the raised metal section 31 to move, this movement being liable to degrade the quality of the electrical connection between the electrical connection pad 30 and the readout circuit 10.

The inventors have also demonstrated that the raised metal section 31 of the electrical connection pad 30 has a greater mechanical strength when it rests on a reinforcing layer section 4 the surface extent of which is controlled and at least partially preserved from chemical attack by the protection wall 34. It is thus possible to ensure the reinforcing section 4 has a surface extent such that it is larger than or equal to at least 25% of that of the lower surface of the raised metal section, and preferably larger than or equal to at least 50%, or even 75% or more. As described below, the section 4 of the layer of reinforcing material may be obtained from the sacrificial layer used during the production of the absorbing membrane 21 and the raised metal section 31.

Figure 3B:
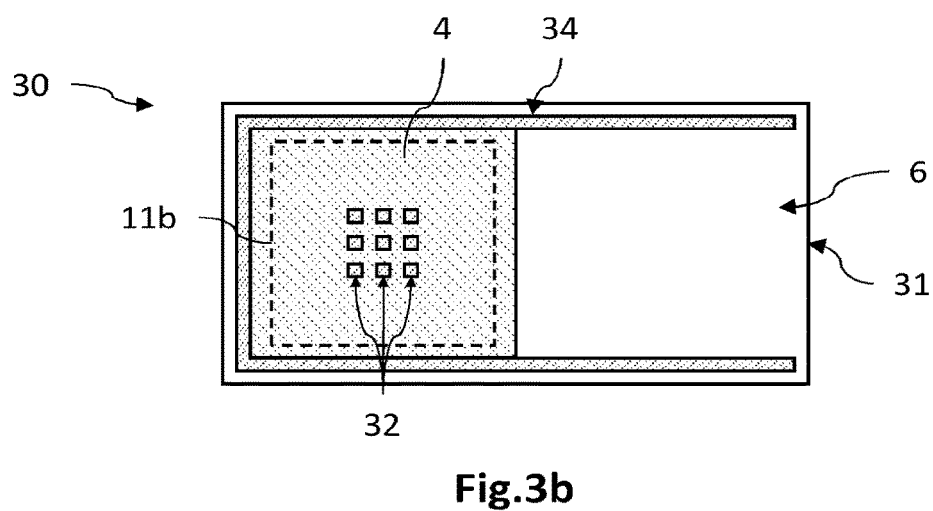

FIG. 3b is a schematic top view of an electrical connection pad according to one variant of the connection pad illustrated in FIG. 3a.

The detection device is similar to that described with reference to FIG. 2 and differs therefrom essentially in that the protection wall 34 extends continuously so as to define a cavity 3 that is open locally. By a cavity that is open locally, what is meant is a cavity comprising at least one aperture 6 in the (X, Y)-plane. The protection wall 34 then does not form a closed perimeter. The aperture 6 here has a height substantially equal to the distance H and a width in the (X, Y)-plane such that following a step of etching by acid attack in vapour-phase HF acid medium, the reinforcing section 4 in the cavity 3 has a surface extent, in the (X, Y)-plane, that is larger than or equal to 25%, or even larger than or equal to 50% and preferably larger than or equal to 75% of that of the lower surface 33 of the raised metal section 31. The width of the aperture 6 is then determined prior to the formation of the protection wall 34, in particular depending on an estimation of the etch rate of a sacrificial layer section located under the raised metal section 31 and in the absence of protection wall 34, as described below.

In this example, the protection wall 34 defines a cavity 3 the cross section of which in the (X, Y)-plane has a rectangular shape of 80 μm×40 μm area. The protection wall 34 extends so that the cavity 3 has an aperture 6 that here is located level with one of the two 40 μm sides of the cavity. In the case of an acid attack by vapour-phase HF of a sacrificial layer made of silicon oxide, it has been observed that the etch rate under the raised metal section 31 is higher, for example about 20 times higher, then the etch rate beyond this raised metal section 31. Thus, by way of illustration, the time required to etch a 2 μm thickness of a sacrificial layer section located beyond the connection pad 30 leads to an etch, under the raised metal section 31, of a sacrificial layer section that extends from the aperture 6 along the X-axis over a distance of 40 μm. Thus, under the raised metal section 31, a sacrificial layer section of an area of 40 μm×40 μm is removed by etching, and a section 4 that is called the reinforcing section of an area of 40 μm×40 μm is preserved. The raised metal section 31 rests on the reinforcing section 4 and its mechanical strength is thus increased. Advantageously, the conductive vias 32 are located level with the reinforcing section 4 and pass therethrough vertically. Alternatively or in addition, conductive vias 32 may be located in the zone of the cavity 3 devoid of reinforcing section 4.

The protection wall 34 may include a plurality of rectilinear segments, i.e. a plurality of protection wall portions, that extend longitudinally and rectilinearly in the (X, Y)-plane. Each segment has a longitudinal dimension, or length, and a thickness in the (X, Y)-plane, the length being larger than the thickness, and preferably at least 10 times larger, i.e. larger than or equal to times the thickness. The segments may be joined together in pairs so as to form together a protection wall that extends continuously, as illustrated in FIGS. 3a and 3b. The junction between two consecutive segments may have a curved shape in the (X, Y)-plane. As a variant, the segments may not be joined together in pairs.

FIGS. 4a to 4g illustrate various steps of a process for producing the detection device according to the first embodiment. A plurality of steps, except for the step of forming the protection wall 34, may be similar or identical to those of the process described in document EP2743659.

Figure 4A:
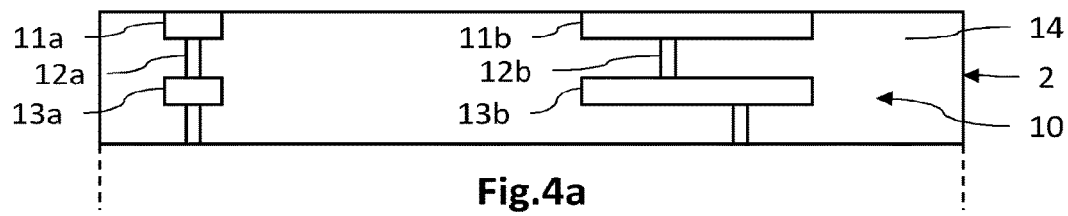
FIGS. 4a to 4g show the steps of a process for producing the detection device illustrated in FIG. 2.

With reference to FIG. 4a, a substrate 2 including a CMOS readout circuit 10 is produced. The readout circuit 10 here includes an electrical interconnection level including a first section 11a and a second section 11b of a metal line. The sections 11a, 11b are electrically connected to metal-line sections 13a, 13b of a lower electrical interconnection level by conductive vias 12a, 12b. The vias and the metal lines are separated from one another by inter-metal dielectric layers. The substrate 2 here includes an upper face level with which the metal-line sections 11a, 11b and the inter-metal dielectric layer 14 are flush. This step of producing the substrate may be identical or similar to that described in document EP2743659. Thus, by way of illustration, the conductive vias 12a, 12b and the metal-line sections 11a, 11b, 13a, 13b may be made from copper or tungsten using a Damascene process in which trenches produced in the inter-metal dielectric layer are filled with copper. The copper or tungsten may optionally be transversely intermediate between vertical layers made of titanium nitride or tantalum nitride inter alias. The flush alignment of the metal-line sections 11a, 11b level with the upper face of the inter-metal dielectric layer 14 may be achieved using a chemical-mechanical-polishing (CMP) technique.

Figure 4B:
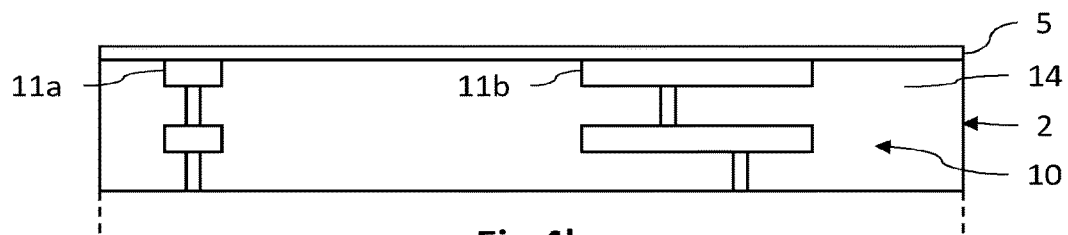

With reference to FIG. 4b, an etch-stop layer 5 is then deposited on the upper face of the substrate 2. The etch-stop layer 5 thus continuously covers the inter-metal dielectric layer 14 and the metal-line sections 11a, 11b. It may be obtained, by way of example, by atomic layer deposition (ALD) of alumina $Al_2O_3$. Other materials may be suitable, such as aluminum nitride, aluminum trifluoride or even unintentionally doped amorphous silicon.

Figure 4C:
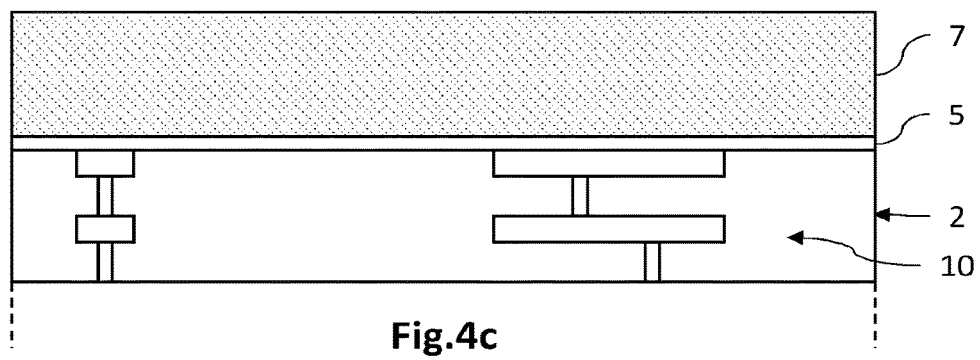

With reference to FIG. 4c, a sacrificial layer 7 made of a preferably mineral material and for example made of silicon oxide deposited by plasma-enhanced chemical vapour deposition (PECVD) is deposited on the etch-stop layer 5. It extends continuously over substantially all the surface of the substrate 2 and covers the etch-stop layer 5. The thickness along the Z-axis of the sacrificial layer 7 subsequently defines the distance H of separation between the absorbing membrane 21 and the substrate 2, and between the raised metal section 31 and the substrate 2. It in particular depends on the absorbing properties of the thermal detectors that it is desired to obtain, and may be comprised between 1 µm and 5 µm for the detection of infrared radiation, and for example equal to about 2 µm.

Figure 4D:
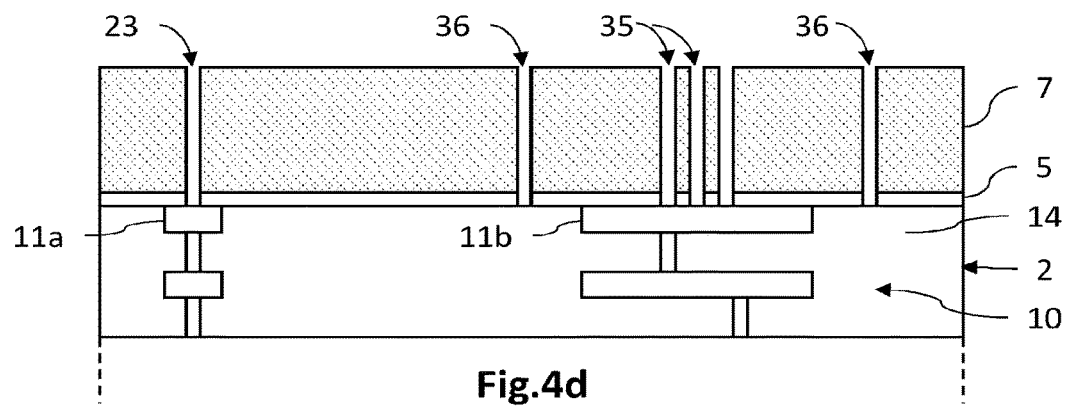

With reference to FIG. 4d, vertical orifices 23, 35 that are intended for the formation of the anchoring pillars 22 of the thermal detector 20 on the one hand and of the conductive vias 32 of the electrical connection pad 30 on the other hand, are produced. They are produced by photolithography and etching, and pass through the sacrificial layer 7 and the etch-stop layer 5 in order to open onto the first metal-line section 11a and second metal-line section 11b, respectively. The vertical orifices 23, 35 may have in the (X, Y)-plane a square cross section of area here substantially equal to 0.25 µm².

A trench 36 intended for the formation of the protection wall 34 is also produced. The trench 36 is produced by photolithography and etching, and passes through the sacrificial layer 7 and here opens onto the inter-metal dielectric layer 14. Therefore, in this example it also passes through the etch-stop layer 5. The trench 36 extends longitudinally in the (X, Y)-plane so as to subsequently define the cavity 3. It here has a thickness, or width, in the (X, Y)-plane of dimension substantially equal to 0.5 µm. Preferably, the trench 36 and the vertical orifices 23, 35 are produced concomitantly, i.e. simultaneously.

Figure 4E:
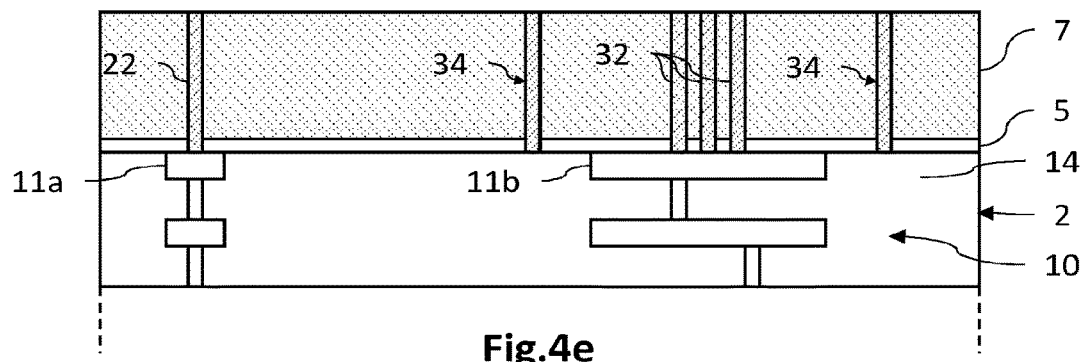

With reference to FIG. 4e, next the anchoring pillars 22 and conductive vias 32 are produced in the vertical orifices 23, 35 and the protection wall 34 is produced in the trench 36. The anchoring pillars 22 and the conductive vias 32 may be produced in an identical way in terms of dimensions and materials. They may be produced by filling the orifices 23, 35 with one or more electrically conductive materials. By way of example, they may each include a TiN layer deposited by metal organic chemical vapour deposition (MOCVD) on the vertical flanks of the orifices 23, 35, and a core made of copper or tungsten filling the space defined transversely by the TiN layer. The protection wall 34, anchoring pillars 22 and the conductive vias 32 may be produced concomitantly and in an identical way in terms of materials. The protection wall may thus be formed by filling the trench 36 with a TiN layer deposited by MOCVD on the vertical flanks of the trench 36 then with a core made of copper or tungsten filling the space defined transversely by the TiN layer. A CMP step then allows the upper surface formed by the sacrificial layer 7 and by the conductive vias 32, the anchoring pillars 22 and the protection wall 34 to be planarized.

Figure 4F:
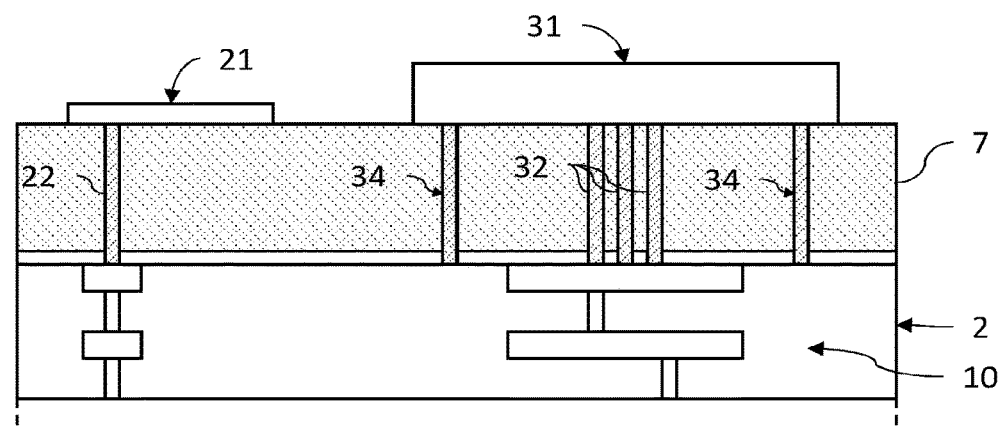

With reference to FIG. 4f, the suspended membrane 21 and the raised metal section 31 are produced. This step may be carried out in an identical or similar way to that described in document EP2743659 and is not described in detail. Thus, the absorbing membrane 21 may include a first material suitable for absorbing the electromagnetic radiation of interest and a second thermistor material the electrical conductivity of which varies as a function of the temperature of the membrane. The raised metal section 31 includes a section of an electrically conductive material, for example aluminum, that is optionally intermediate along the Z-axis between two TiN sections. These conductive sections are produced conventionally by deposition, photolithography and then etching. The raised metal section 31 rests on the conductive vias 32 that ensure the electrical connection with the readout circuit 10. By way of illustration, it may have an area, in the (X, Y)-plane, of about 100 µm×100 µm.

Figure 4G:
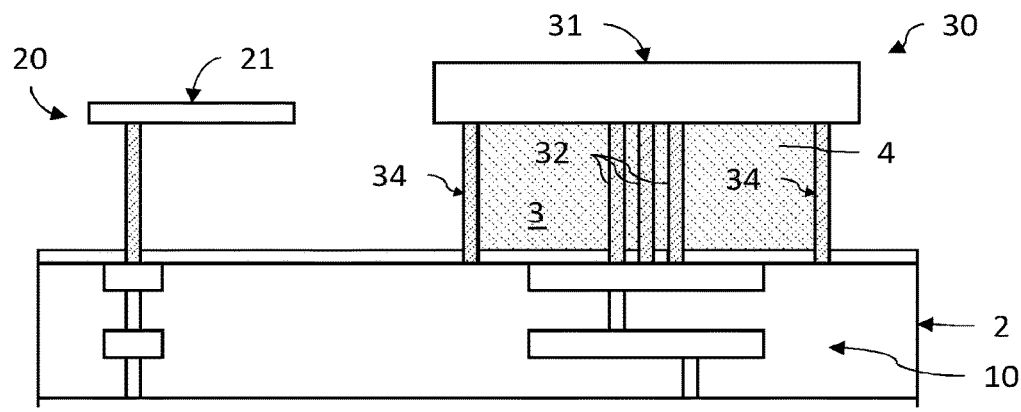

With reference to FIG. 4g, the sacrificial layer 7 is partially etched so as to suspend the absorbing membrane 21. The etching step may be carried out by a chemical attack in vapour-phase hydrofluoric (HF) acid. The chemical attack etches substantially all the sacrificial layer 7 located level with the thermal detector 20, thus allowing the absorbing membrane 21 to be suspended above the substrate 2. A reflective layer (not shown) is advantageously located level with the substrate 2 facing the absorbing membrane 21 so that the empty space forms a quarter-wave optical cavity that reinforces the absorption of the radiation of interest by the thermal detector. Level with the electrical connection pad 30, the chemical attack by vapour etches the sacrificial layer 7, with the exception of the sacrificial layer section 4 located in the closed cavity 3 defined by the protection wall 34. The unetched section 4 of the sacrificial layer 7 thus forms the reinforcing section 4 on which the raised metal section 31 rests, this reinforcing section 4 increasing the mechanical strength of the raised metal section 31.

The inventors have observed that a chemical attack of the sacrificial layer and in particular of a layer made of silicon oxide by vapour-phase HF acid has a first etch rate level with the thermal detectors and a second etch rate that is substantially higher than the first (for example 5 times higher or even 10 and more times higher) when the sacrificial layer section to be etched is located under the raised metal section. The inventors have thus observed that the etch rate by chemical attack in HF vapour greatly increases when the layer to be etched is located in a chamber, defined vertically between two surfaces that are opposite each other, the aspect ratio L/H of which is higher than or equal to 2, L being a transverse dimension of the chamber in the (X, Y)-plane and H being the height of the chamber along the Z-axis.

In this example, the chamber defined vertically by the substrate and the raised metal section has a dimension L in the (X, Y)-plane of about 100 µm and a height H along the Z-axis of about 2 µm. The etching of the sacrificial layer section in this chamber is thus about 20 times faster than the etching of the same sacrificial layer outside of this chamber.

Specifically, it would appear that the products of the chemical reaction of the etching of the sacrificial layer, for example water when the sacrificial layer is made of silicon oxide, cannot freely disperse because of the effect of confinement in the chamber of high aspect ratio L/H. The products then seem to act as catalysts for the etching and substantially increase the etch rate in the chamber.

Thus, in the absence of protection wall 34, as in the example described in prior-art document EP2743659, a large portion of the sacrificial layer located under the raised metal section may be etched, this possibly leading to the raised metal section to rest on a sacrificial layer section of too small a surface extent—this causing its mechanical strength to then decrease.

According to the invention, the presence of the protection wall 34 allows a cavity 3 to be defined such that the sacrificial layer section that is found therein is partially or completely preserved from the chemical attack. Thus, the surface extent of the unetched section thus forming a reinforcing section 4 ensuring the raised metal section 31 has a better mechanical strength is controllable.

In the example in FIG. 3a, the cavity 3 is closed and substantially hermetic with respect to the chemical attack by HF vapour. Thus, the sacrificial layer section located in the cavity 3 is substantially unetched by the chemical attack and thus forms a reinforcing section 4 of large size on which the raised metal section 31 rests. The mechanical strength of this section 31 is thus substantially improved.

Figure 5A:
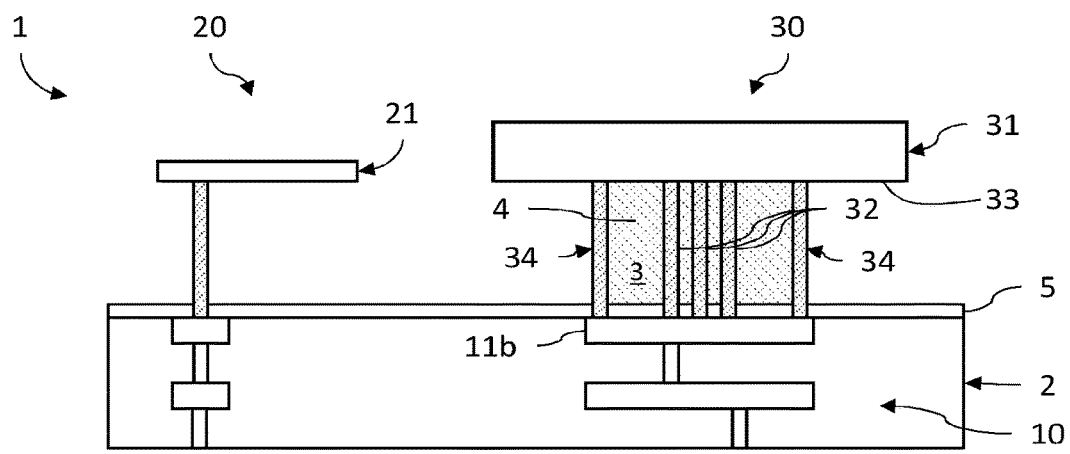
FIGS. 5a and 5b are schematic cross-sectional views of variants of the detection device such as illustrated in FIG. 2.

FIG. 5a is a schematic cross-sectional view of a detection device r according to one variant embodiment.

The detection device 1 is similar to that described with reference to FIG. 2 and differs therefrom essentially in that the protection wall 34 makes mechanical and electrical contact with the metal-line section 11b. The protection wall 34, which is advantageously electrically conductive, also plays the role of an electrical connection between the raised metal section 31 and the metal-line section 11b of the readout circuit 10. The electrical connection is thus improved. Moreover, the metal-line sections 11a and 11b also play the role of an etch-stop layer during the formation of the orifices 23, 35 and of the trench 36 through the sacrificial layer 7.

The size of the metal-line section lib may then be adapted so that the protection wall 34 defines a cavity 3, the surface extent of which in the (X, Y)-plane is larger than or equal to 25%, 50%, 75% or even more than that of the lower surface 33 of the raised metal section 31.

Figure 5B:
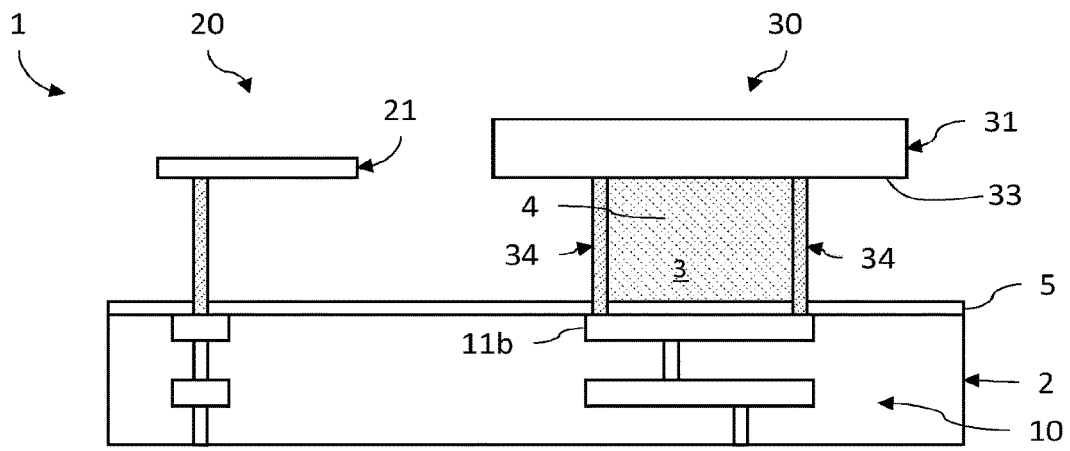

FIG. 5b is a schematic cross-sectional view of a detection device 1 according to another variant embodiment.

The detection device 1 is similar to that described with reference to FIG. 5a and differs therefrom essentially in that the electrical connection pad 30 includes no conductive vias 32 and hence the raised metal section 31 is electrically connected to the metal-line section 11b solely by the protection wall 34, the latter being electrically conductive. The metal-line section 11b then has a shape, in the (X, Y)-plane, that is adapted so that the protection wall 34 makes direct contact therewith.

Particular embodiments have just been described. Various variants and modifications will appear obvious to those skilled in the art.

Thus, as a variant to the embodiment illustrated in FIG. 2, in which embodiment the protection wall makes contact, via its lower portion, with the inter-metal dielectric layers subjacent to the etch-stop layer, the protection wall may rest on the etch-stop layer, and optionally on support pads resting on the etch-stop layer, as described in document EP2840370.

The invention claimed is:

1. A device for detecting electromagnetic radiation, including:
   a readout circuit that is located in a substrate;
   an electrical connection pad, which is placed on said substrate, including a metal section that is raised above said substrate and electrically connected to said readout circuit;
   wherein:
   a protection wall extends under said raised metal section so as to define therewith at least one portion of a cavity, having a longitudinal dimension and a thickness according to a plane parallel to said substrate, said longitudinal dimension being larger than said thickness;
   a reinforcing layer section, made from a mineral material, is located in said cavity, on which said raised metal section rests.

2. The detection device according to claim 1, wherein said reinforcing section has a surface extent that is larger than or equal to 25 of that of what is called a lower surface, which is oriented toward said substrate, of said raised metal section.

3. The detection device according to claim 1, wherein said protection wall extends continuously so as to define a closed cavity.

4. The detection device according to claim 1, wherein said protection wall extends continuously so as to define a cavity that is open locally.

5. The detection device according to claim 1, including at least one thermal detector that is placed on said substrate and electrically connected to said electrical connection pad by said readout circuit, and including a membrane that is suitable for absorbing said electromagnetic radiation to be detected and that is suspended above said substrate at a distance from said latter substantially equal to that separating said raised metal section from said substrate.

6. The detection device according to claim 1, wherein said protection wall is made from an electrically conductive material, said wall electrically connecting said electrical connection pad to said readout circuit.

7. The detection device according to claim 1, wherein said protection wall encircles at least one electrically conductive via electrically connecting said raised metal section to a subjacent section of a metal line of said readout circuit.

8. The detection device according to claim 1, wherein said raised metal section has a lower surface, which is oriented toward said substrate, a dimension of which parallel to said substrate is larger than or equal to 2 times said distance separating said raised metal section from said substrate along an axis that is substantially orthogonal to said substrate.

9. The detection device according to claim 1, wherein said electrical connection pad includes substantially no reinforcing section outside of said cavity.

10. The detection device according to claim 1, wherein said protection wall includes a plurality of rectilinear segments, each segment having a longitudinal dimension and a thickness in a plane parallel to said substrate, said longitudinal dimension being larger than said thickness.

11. A process for producing said detection device according to claim 1, comprising:
   depositing a sacrificial layer on an etch-stop layer covering said substrate containing said readout circuit;
   forming a protection wall through said sacrificial layer, so as to subsequently define at least one portion of a cavity;

forming a raised metal section on said sacrificial layer, so that it rests on said protection wall and participates in said definition of said cavity;

etching at least partially said sacrificial layer, a section of said sacrificial layer, called said reinforcing section, which is located in said cavity, being unetched following this said etching step.

12. The process according to claim 11, wherein said sacrificial layer is made of a mineral material and wherein said etching step is carried out by chemical attack in an acid medium.

13. The process according to claim 11, wherein, concomitantly to said formation of said protection wall, anchoring pillars are formed that are intended to mechanically support absorbing membranes of thermal detectors.

14. The detection device according to claim 1, wherein said reinforcing section has a surface extent that is larger than or equal to 50% of that of what is called a lower surface, which is oriented toward said substrate, of said raised metal section.

15. The detection device according to claim 1, wherein said reinforcing section has a surface extent that is larger than or equal to 75% of that of what is called a lower surface, which is oriented toward said substrate, of said raised metal section.

16. The detection device according to claim 1, wherein said raised metal section has a lower surface, which is oriented toward said substrate, a dimension of which parallel to said substrate is larger than or equal to 10 times said distance separating said raised metal section from said substrate along an axis that is substantially orthogonal to said substrate.

17. The detection device according to claim 1, wherein said raised metal section has a lower surface, which is oriented toward said substrate, a dimension of which parallel to said substrate is larger than or equal to 25 times said distance separating said raised metal section from said substrate along an axis that is substantially orthogonal to said substrate.

18. The process according to claim 11, wherein said sacrificial layer is made of a material based on silicon oxide, and wherein said etching step is carried out by chemical attack in vapour-phase hydrofluoric acid.

* * * * *